US008730750B1

(12) United States Patent
Trivedi et al.

(10) Patent No.: US 8,730,750 B1
(45) Date of Patent: May 20, 2014

(54) MEMORY DEVICE WITH CONTROL CIRCUITRY FOR GENERATING A RESET SIGNAL IN READ AND WRITE MODES OF OPERATION

(71) Applicant: LSI Corporation, Milpitas, CA (US)

(72) Inventors: Manish Trivedi, Ghaziabad (IN); Setti Shanmukheswara Rao, Bangalore (IN); Ankur Goel, Bangalore (IN)

(73) Assignee: LSI Corporation, San Jose, CA (US)

( * ) Notice: Subject to any disclaimer, the term of this patent is extended or adjusted under 35 U.S.C. 154(b) by 40 days.

(21) Appl. No.: 13/662,504

(22) Filed: Oct. 28, 2012

(51) Int. Cl.
G11C 7/02 (2006.01)
G11C 7/22 (2006.01)
G11C 7/14 (2006.01)

(52) U.S. Cl.
CPC . G11C 7/227 (2013.01); G11C 7/14 (2013.01)
USPC ........................................................ 365/210.1

(58) Field of Classification Search
CPC .......... G11C 7/14; G11C 7/227; G11C 16/28; G11C 11/4099
USPC ...................................................... 365/210.1
See application file for complete search history.

(56) References Cited

U.S. PATENT DOCUMENTS

| | | | |
|---|---|---|---|
| 5,608,681 A * | 3/1997 | Priebe et al. | 365/207 |
| 5,999,482 A | 12/1999 | Kornachuk et al. | |
| 6,088,279 A | 7/2000 | Ishii | |
| 6,181,626 B1 * | 1/2001 | Brown | 365/210.1 |
| 6,201,757 B1 | 3/2001 | Ward et al. | |
| 6,212,117 B1 | 4/2001 | Shin et al. | |
| 6,229,746 B1 * | 5/2001 | Tooher | 365/194 |
| 6,388,931 B1 | 5/2002 | Wilkins | |
| 6,714,472 B2 | 3/2004 | Wilkins | |
| 6,738,296 B2 | 5/2004 | Sung et al. | |
| 6,999,367 B2 * | 2/2006 | Yamagami | 365/210.1 |

(Continued)

OTHER PUBLICATIONS

U.S. Appl. No. 13/561,673, filed Jul. 30, 2012 in the name of M. Trivedi et al. and entitled "Memory Device with Separately Controlled Sense Amplifiers."
B.S. Amrutur et al., "A Replica Technique for Wordline and Sense Control in Low-Power SRAM's," IEEE Journal of Solid-State Circuits, Aug. 1998, pp. 1208-1219, vol. 33, No. 8.

(Continued)

Primary Examiner — Kretelia Graham
(74) Attorney, Agent, or Firm — Ryan, Mason & Lewis, LLP

(57) ABSTRACT

A memory device includes a memory array comprising a plurality of memory cells, a plurality of sense amplifiers configured to sense data stored in the memory cells of the memory array, a dummy wordline coupled to respective enable inputs of the sense amplifiers, a dummy wordline return, a dummy bitline, a dummy sense amplifier having an input coupled to the dummy bitline, and control circuitry coupled to the output of the dummy sense amplifier and the dummy wordline return. The control circuitry has a first configuration for generating a reset signal based at least in part on a signal at the output of the dummy sense amplifier in a read mode of operation, and has a second configuration different than the first configuration for generating the reset signal based at least in part on a signal on the dummy wordline return in a write mode of operation.

22 Claims, 9 Drawing Sheets

(56) References Cited

U.S. PATENT DOCUMENTS

| | | | |
|---|---|---|---|
| 7,161,855 B2* | 1/2007 | Kodama | 365/194 |
| 7,499,347 B2* | 3/2009 | Chen et al. | 365/194 |
| 7,746,716 B2 | 6/2010 | Jetton et al. | |
| 8,630,135 B2* | 1/2014 | Douzaka | 365/194 |
| 2008/0298143 A1 | 12/2008 | Chen et al. | |
| 2012/0008438 A1 | 1/2012 | Jain et al. | |
| 2012/0257464 A1* | 10/2012 | Moriwaki | 365/189.11 |
| 2013/0258794 A1* | 10/2013 | Sharad et al. | 365/205 |

OTHER PUBLICATIONS

U. Arslan et al., "Variation-Tolerant SRAM Sense-Amplifier Timing Using Configurable Replica Bitlines," IEEE Custom Integrated Circuits Conference (CICC), Nov. 2008, pp. 415-418.

M-F. Chang et al., "Improving the Speed and Power of Compilable SRAM Using Dual-Mode Self-Timed Technique," IEEE International Workshop on Memory Technology, Design and Testing (MTDT), Dec. 2007, pp. 57-60, Taipei, Taiwan.

* cited by examiner

MEMORY DEVICE WITH CONTROL CIRCUITRY FOR GENERATING A RESET SIGNAL IN READ AND WRITE MODES OF OPERATION

BACKGROUND

A semiconductor memory device typically includes an array of memory cells arranged in rows and columns, with each memory cell configured to store a data bit. The memory cells within a given row of the array are coupled to a common wordline, while the memory cells within a given column of the array are coupled to a common bitline. Thus, the array includes a memory cell at each point where a wordline intersects with a bitline.

In a semiconductor memory device of the type described above, data may be written to or read from the memory cells of the array using a memory cycle that is divided into an active phase and a precharge phase, with the active phase being used to read or write one or more memory cells of the array and the precharge phase being used to precharge the bitlines to a precharge voltage in preparation for the next cycle. Reading a given memory cell generally comprises transferring data stored within that cell to its corresponding bitline, and writing a given memory cell generally comprises transferring data into that cell from its corresponding bitline.

For a given read or write operation, the corresponding memory cycle is more particularly referred to as a read cycle or a write cycle, respectively. In certain types of memory devices, such as static random access memories (SRAMs), the read and write cycle times are not equal. The read access time is typically longer than the write access time, while the write precharge time is longer than the read precharge time.

As is well known to those skilled in the art, read and write self-time tracking arrangements may be used in order to establish appropriate signal timing for respective read and write operations. Such self-time tracking functionality is often designed to control the read and write signal timing over expected process, voltage and temperature (PVT) variations. This is particularly important for high-speed operations having read and write cycle frequencies in the gigahertz (GHz) range.

A conventional self-time tracking arrangement of this type utilizes a dummy row of memory cells and a dummy column of memory cells, associated with a dummy wordline and a dummy bitline, respectively, with those memory cells being configured in substantially the same manner as the actual memory cells of the memory array. A dummy wordline driver generates a dummy wordline signal for application to the dummy wordline with substantially the same timing as an actual wordline signal applied to an actual wordline of the memory array. The dummy wordline and dummy bitline are also known as a self-time wordline (STWL) and a self-time bitline (STBL), respectively.

In order to permit independent control of the read and write cycle times, self-time tracking circuitry may be separated into two paths, one for read and another for write. This approach is also called dual mode self-time (DMST).

Conventional approaches to reading data from a memory cell include the use of differential sense amplifiers. In a typical conventional arrangement, sense amplifiers are associated with respective columns of the memory array. For each read memory cycle, the sense amplifier is turned on in order to sense data on a corresponding bitline, and then turned off once the sensed data is latched at the sense amplifier output. The sense amplifier is turned on and off responsive to respective logic states of a sense amplifier enable signal. The turning on and turning off of the sense amplifier is also referred to as enabling and disabling the sense amplifier. The use of differential sense amplifiers generally provides faster sensing with lower dynamic power consumption than single-ended sensing arrangements.

However, controlling the timing of the transitions in the sense amplifier enable signal can be problematic, particularly for high-speed read operations. For example, in conventional arrangements, the sense amplifier enable signal may be provided by a sense latch, with the sense latch being set and reset in order to turn on and turn off the sense amplifiers. More particularly, the sense latch may be reset responsive to a pulse of a sense off signal that corresponds to a delayed and inverted version of the sense amplifier enable signal, as returned to the sense latch from a final one of the sense amplifiers. It can be very difficult to accurately control the delay of the sense off signal, particularly over PVT variations. As a result, read memory cycle time is increased, thereby degrading memory access time performance.

SUMMARY

Embodiments of the invention provide, by way of example, memory devices in which read and write reset signals are generated in an accurate and efficient manner. For example, a given such arrangement can allow better control of read and write timing over PVT variations, thereby facilitating high-speed read and write operations.

In one embodiment, a memory device includes a memory array comprising a plurality of memory cells, a plurality of sense amplifiers configured to sense data stored in the memory cells of the memory array, a dummy wordline coupled to respective enable inputs of the sense amplifiers, a dummy wordline return, a dummy bitline, a dummy sense amplifier having an input coupled to the dummy bitline, and control circuitry coupled to the output of the dummy sense amplifier and the dummy wordline return. The control circuitry has a first configuration for generating a reset signal based at least in part on a signal at the output of the dummy sense amplifier in a read mode of operation, and has a second configuration different than the first configuration for generating the reset signal based at least in part on a signal on the dummy wordline return in a write mode of operation.

Other embodiments of the invention include but are not limited to methods, integrated circuits and processing devices.

A memory device in accordance with embodiments of the invention may be implemented, for example, as a stand-alone memory device, such as a packaged integrated circuit, or as an embedded memory in a microprocessor or other processing device.

DETAILED DESCRIPTION

Embodiments of the invention will be illustrated herein in conjunction with exemplary semiconductor memory devices having memory arrays and associated control circuitry configured to generate reset signals for read and write modes of operation. It should be understood, however, that embodiments of the invention are more generally applicable to any semiconductor memory device in which improvements in read and write performance are desired, and may be implemented using circuitry other than that specifically shown and described in conjunction with the illustrative embodiments.

Figure 1:
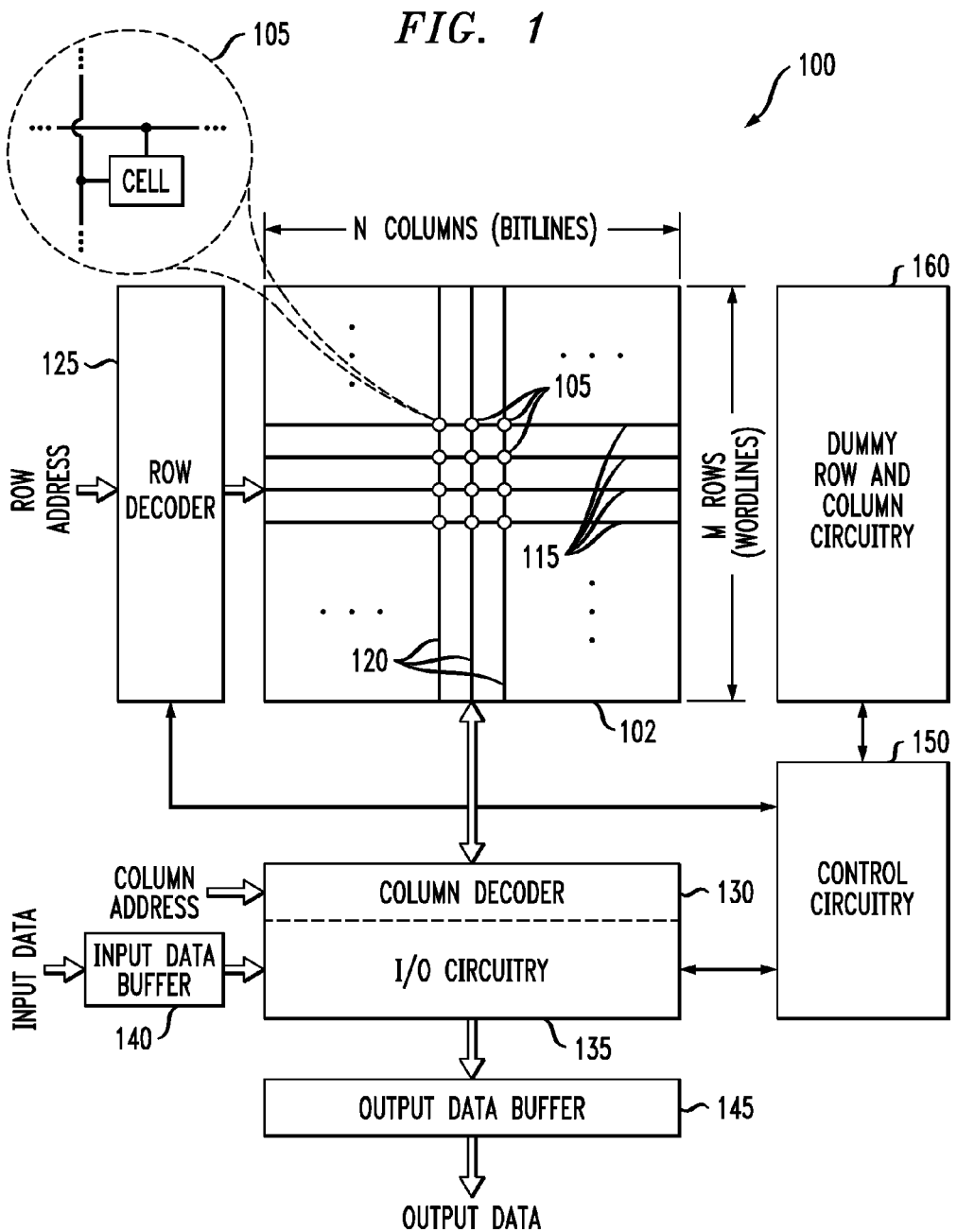
FIG. 1 is a block diagram of a semiconductor memory device comprising a memory array having a plurality of memory cells and incorporating control circuitry configured to generate reset signals for read and write operations.

FIG. 1 shows a block diagram of a memory device 100 in accordance with an illustrative embodiment of the invention. The memory device 100 comprises a memory array 102. The memory array 102 comprises a plurality of memory cells 105 each configured to store a single bit of data. Such memory cells are also referred to herein as "bitcells." Each cell 105 is coupled to a corresponding row or wordline 115 and column or bitline 120. The memory array therefore includes a memory cell at each point where a wordline intersects with a bitline. The memory cells of the memory array are illustratively arranged in N columns and M rows. The values selected for N and M in a given implementation will generally depend upon on the data storage requirements of the application in which the memory device is utilized. In some embodiments, one of N and M may have value 1, resulting in an array comprising a single column of memory cells or a single row of memory cells.

Particular ones of the memory cells 105 of the memory array 102 can be activated for writing data thereto or reading data therefrom by application of appropriate row and column addresses to respective row decoder 125 and column decoder 130. Other elements of the memory device 100 include input/output (I/O) circuitry 135, an input data buffer 140 and an output data buffer 145. The I/O circuitry 135 in the present embodiment is assumed by way of example to comprise a plurality of sense amplifiers, such as differential sense amplifiers coupled to respective columns of the memory array 102. The operation of these and other memory device elements, such as row decoder 125, column decoder 130, and buffers 140 and 145, is well understood in the art and will not be described in detail herein.

Although memory array 102 is identified in FIG. 1 as comprising the cells 105 and their associated wordlines and bitlines 115 and 120, the term "memory array" as used herein is intended to be more broadly construed, and may encompass one or more associated elements such as the row and column decoders 125 and 130, the I/O circuitry 135, or the input and output data buffers 140 and 145, or portions thereof.

Also, the wordlines 115 and bitlines 120, although shown as respective single lines in FIG. 1, may each comprise a corresponding pair of differential lines. By way of example, differential bitlines herein may be denoted as BL and BLB. Also, separate read and write wordlines or bitlines may be used, and a given such read or write wordline or bitline may comprise a corresponding pair of differential lines.

The memory device 100 in one or more of the illustrative embodiments may be assumed to comprise a static random access memory (SRAM) device. However, as indicated previously, the disclosed control circuitry with reset signal generation functionality can be adapted in a straightforward manner for use with other types of memory devices, including, for example, dynamic random access memory (DRAM), electrically erasable programmable ROM (EEPROM), magnetic RAM (MRAM), ferroelectric RAM (FRAM), phase-change RAM (PC-RAM), etc. Also, other types of memory cell configurations may be used. For example, the memory cells 105 in the memory array 102 could be multi-level cells each configured to store more than one bit of data. Embodiments of the invention are therefore not limited in terms of the particular storage or access mechanism utilized in the memory device.

The present embodiment of memory device 100 is configured to avoid one or more of the drawbacks of conventional practice through the use of control circuitry 150 that is configured to generate reset signals for read and write operations in a manner that provides better control of read and write timing in the memory array 102 over PVT variations, thereby facilitating high-speed read and write operations.

By way of example, in a read mode of operation a reset signal may be asserted responsive to sensing of a signal transition on a dummy bitline by a dummy sense amplifier and in a write mode of operation the reset signal may be asserted responsive to a signal transition on a dummy wordline return. Assertions of the read signal may comprise respective signal pulses, with the reset signal in the read mode of operation being asserted earlier in time than the reset signal in the write mode of operation. This causes an internal clock signal and one or more additional global signals of the memory array 102, such as actual wordline signals, to have shorter pulse widths in the read mode of operation than these signals have in the write mode of operation.

The control circuitry 150 may comprise signal generation circuitry configured to generate at least one internal clock signal for the memory device 100 at least in part as a function of the reset signal.

As will be described in greater detail below, in one or more of the illustrative embodiments, the memory device 100 exhibits shorter read and write memory cycles and lower power consumption, as well as improved overall operating performance, relative to conventional devices.

The memory device 100 as illustrated in FIG. 1 may include other elements in addition to or in place of those specifically shown, including one or more elements of a type commonly found in a conventional implementation of such a memory device. These and other conventional elements, being well understood by those skilled in the art, are not described in detail herein. It should also be understood that the particular arrangement of elements shown in FIG. 1 is presented by way of illustrative example only. Those skilled in the art will recognize that a wide variety of other memory device configurations may be used in implementing embodiments of the invention.

Figure 2A:
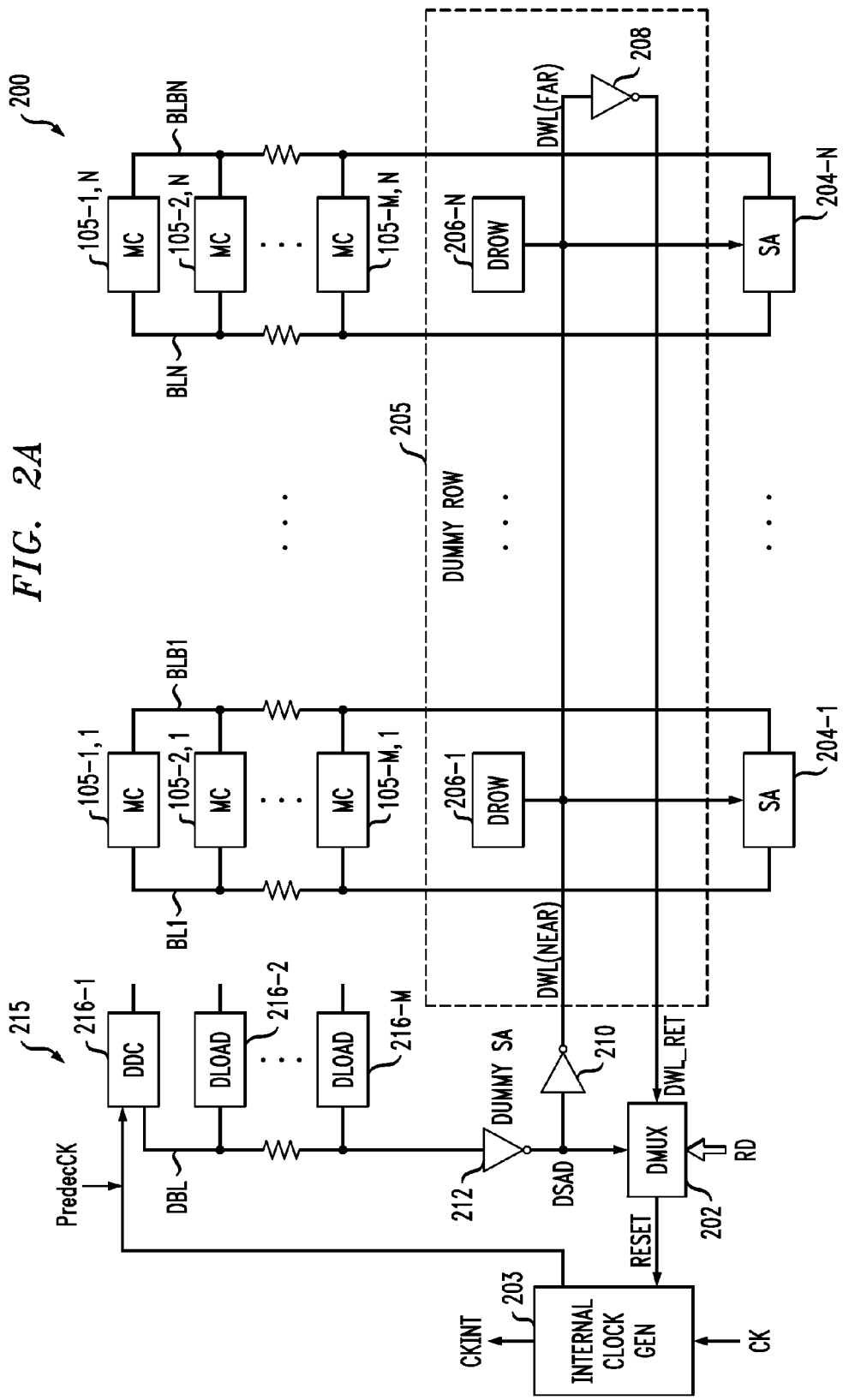
FIG. 2A shows a more detailed view of a portion of the FIG. 1 memory device.

Referring now to FIG. 2A, a portion 200 of the FIG. 1 memory device 100 is shown. In this embodiment, the memory array 102 includes N pairs of read bitlines 120, with one such pair associated with each column of the memory array, and each pair comprising a read bitline BL and its complement BLB. As mentioned previously, the memory array comprises memory cells 105 arranged in M rows and N columns, from an initial memory cell 105-1,1 of the first column to a final memory cell 105-M,N of the last column.

The control circuitry 150 in this embodiment comprises a dummy signal multiplexer (DMux) 202 and an internal clock generator 203. The dummy signal multiplexer generates a reset signal that is applied to the internal clock generator 203. The internal clock generator 203 in the present embodiment utilizes the reset signal and an external clock signal CK to generate an internal clock signal CKINT that is used to control timing of read and write operations in the memory device 100. The internal clock generator 203 is further assumed to generate one or more additional clock signals that are utilized by the memory device 100, including in the present embodiment a predecoder clock PredecCK, which may be generated using the internal clock signal CKINT.

In the present embodiment, it is assumed that the internal clock signal CKINT has a rising edge that is triggered by a rising edge of the external clock CK, and a falling edge that is triggered by a rising edge of the reset signal, as will be described below in conjunction with the timing diagrams of FIGS. 5A, 5B and 5C. Accordingly, the internal clock signal CKINT has a pulse width that is controlled at least in part by the reset signal. Other global signals used in the memory array 102, including actual wordline signals WL and the PredecCK signal, are gated by the CKINT signal, and therefore also have pulse widths that are indirectly controlled by the reset signal.

The multiplexer 202 and internal clock generator 203 may be viewed individually or collectively as examples of what is more generally referred to herein as "signal generation circuitry." Of course, other types of signal generation circuitry may be used in this and other embodiments.

The multiplexer 202 is coupled to a dummy bitline (DBL) and a dummy wordline (DWL), and operates at least in part responsive to an applied control signal, illustratively a read control signal denoted RD. In the present embodiment, the control signal RD has a first logic level for a read mode of operation of the memory device 100 and a second logic level for a write mode of operation of the memory device 100. Thus, for example, the RD signal may be assumed to have a logic "0" level for the read mode of operation and a logic "1" level for the write mode of operation. In other embodiments, different types of control signaling may be used, possibly involving separate read and write control signals. Accordingly, a read control signal may have a first logic level indicative of a read operation being performed and a second logic level indicative of a read operation not being performed, and a separate write control signal may have a first logic level indicative of a write operation being performed and a second logic level indicative of a write operation not being performed. Also, a given memory device may have multiple read modes and multiple write modes, with the control signaling being adjusted to accommodate these multiple modes.

The I/O circuitry 135 comprises a plurality of output sense amplifiers (SAs) 204-1 through 204-N that are configured to sense stored data associated with respective columns of the memory array 102 in conjunction with read operations directed to the array. Each of the output sense amplifiers 204 is configured to sense data associated with a corresponding one of the read bitline pairs. Thus, for example, output sense amplifier 204-1 is coupled to the read bitline BL1 and its complement BLB1 of the first read bitline pair 120. Similarly, output sense amplifier 204-N is coupled to the read bitline BLN and its complement BLBN of the final read bitline pair 120. The output sense amplifiers 204 are therefore implemented as differential sense amplifiers in the present embodiment, although use of differential sense amplifiers should not be viewed as a requirement of embodiments of the invention.

Each of the sense amplifiers 204 has a corresponding enable input coupled to the dummy wordline DWL, with the enable input illustratively receiving what is referred to herein as a sense amplifier control signal, or more specifically a sense amplifier enable signal, over the dummy wordline DWL. The DWL signal carried by the dummy wordline DWL in the present embodiment is assumed to transition from a logic "0" level to a logic "1" level in order to enable the sense amplifiers 204, and to transition from its logic "1" level to its logic "0" level in order to disable the sense amplifiers 204, although other types and configurations of sense amplifier control signals may be used in other embodiments.

For example, other embodiments of the present invention may implement separate sense amplifier control signals for respective ones of the sense amplifiers 204, in the manner described in U.S. patent application Ser. No. 13/561,673, filed Jul. 30, 2012 and entitled "Memory Device with Separately Controlled Sense Amplifiers," which is commonly assigned herewith and incorporated by reference herein.

The dummy row and column circuitry 160 in this embodiment more particularly comprises a dummy row 205 which includes a plurality of dummy memory cells 206-1 through 206-N, each also denoted as a DROW cell. Each of the dummy memory cells 206 in the dummy row 205 is coupled to the dummy wordline DWL. The dummy wordline DWL is further characterized in this embodiment as having a "near" portion in proximity to the first dummy memory cell 206-1 of the dummy row 205, and a "far" portion in proximity to the last dummy memory cell 206-N of the dummy row 205.

The circuit portion 200 illustrated in FIG. 2 also includes inverters 208, 210 and 212, one or more of which may be viewed as comprising part of the control circuitry 150. Inverter 208 is coupled between the far end of the dummy wordline DWL and a dummy wordline return DWL_RET. The dummy wordline return DWL_RET in the present embodiment returns an inverted version of the DWL signal from inverter 208 at the far end of the dummy wordline DWL back to the multiplexer 202. The dummy wordline return DWL_RET is assumed to be implemented as a metal line.

An output of inverter 210 drives the near end of the dummy wordline DWL, and is configured in the present embodiment to have a driving capability that is substantially the same as that of wordline drivers used to drive respective actual wordlines 115 of the memory array 102.

Inverter 212 serves in the present embodiment as a dummy sense amplifier, although other types of dummy sense amplifiers may be used in other embodiments. The inverter 212 has an input coupled to the dummy bitline DBL and an output that provides a dummy sense amplifier detection (DSAD) signal to the multiplexer 202.

Each of the dummy memory cells 206 of the dummy row 205 is assumed for purposes of the present embodiment to be associated with a corresponding localized dummy row bitline that is not explicitly shown in the figure.

The dummy row and column circuitry 160 in this embodiment further comprises a dummy column 215 which includes a plurality of dummy memory cells 216. The dummy memory cells 216 more particularly comprise single or multiple blocks of dummy discharge cells 216-1, also denoted DDC, and dummy load cells 216-1 through 216-M, each also denoted as a DLOAD cell. Each of the dummy memory cells 216 in the dummy column 215 is coupled to the dummy bitline DBL.

The dummy discharge cell 216-1 receives the predecoder clock signal PredecCK, which is derived by gating a predecoded address signal with the internal clock signal CKINT. The predecoder clock signal line is assumed to be loaded by a predecoder that is not explicitly shown in the figure, and is also triggered by the internal clock signal CKINT.

The clock signal CKINT is used to generate an actual wordline signal that is not explicitly shown in FIG. 2A but triggers dummy discharge cell 216-1 to discharge dummy bitline DBL. The discharge of DBL is detected in the dummy sense amplifier 212 and utilized to generate the DSAD signal applied to multiplexer 202 as well as the DWL signal that is sent via inverter 210 to the dummy memory cells 206 of dummy row 205. The dummy memory cells 206, each of which is a replica of an actual memory cell 105, are arranged along the DWL signal line so as to ensure that the DWL signal experiences substantially the same horizontal RC loading conditions as an actual wordline signal.

Figure 2B:
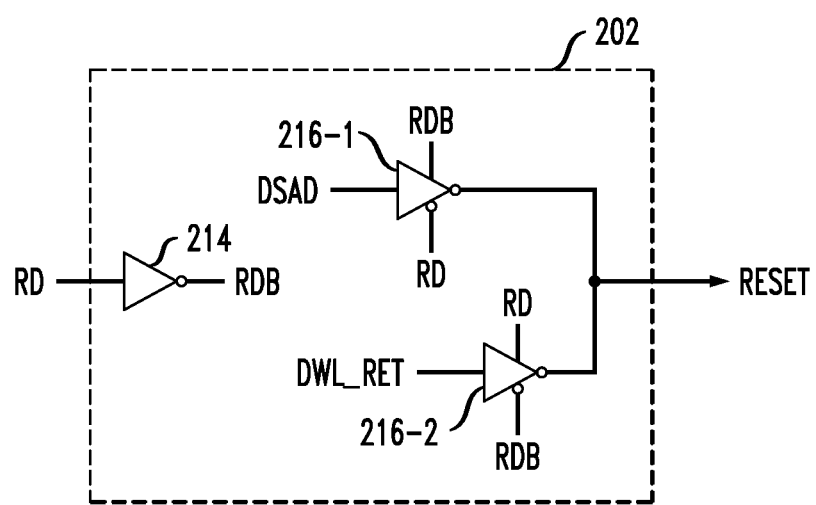
FIG. 2B illustrates a multiplexer in the FIG. 2A embodiment.

FIG. 2B illustrates one possible embodiment of multiplexer 202. In this embodiment, the multiplexer 202 has a first input coupled to the output of the inverter 212 and receiving the DSAD signal therefrom, a second input coupled to the dummy wordline return DWL_RET and receiving a DWL_RET signal therefrom that corresponds to the inverted DWL signal provided by inverter 208. The multiplexer 202 has a reset output providing the reset signal as a function of a selected one of the first and second inputs. The multiplexer 202 further includes a control input that receives the control signal RD, which as indicated above is assumed to be at a logic "0" level for the read mode of operation and is at a logic "1" level for the write mode of operation.

The control signal RD is applied to an input of inverter 214 in the multiplexer 202, in order to generate the complementary signal RDB. The multiplexer 202 also includes a first tristate inverter 216-1 coupled between the first input and the reset output, and a second tristate inverter 216-2 coupled between the second input and the reset output. The first tristate inverter 216-1 has active high and active low control inputs driven by RDB and RD, respectively, and the second tristate inverter 216-2 also has active high and active low control inputs, but driven in an opposite manner by RD and RDB, respectively.

The first and second tristate inverters 216-1 and 216-2 receive at their respective inputs the DSAD and DWL_RET signals referred to above. In the read mode of operation, the multiplexer 202 connects the first input to the reset output via the first tristate inverter 216-1 and disconnects the second input from the reset output via the second tristate inverter 216-2, such that the DSAD signal is provided to the reset output. In the write mode of operation, the multiplexer 202 connects the second input to the reset output via the second tristate inverter 216-2 and disconnects the first input from the reset output via the first tristate inverter 216-1, such that the DWL_RET signal is provided to the reset output.

The multiplexer 202 in the present embodiment is configured such that assertion of the reset signal will vary depending upon whether a read operation or a write operation is being executed. More particularly, in the read mode of operation the reset signal is asserted responsive to sensing of a signal transition on the dummy bitline DBL by the dummy sense amplifier 212 as reflected in the DSAD signal, and in the write mode of operation the reset signal is asserted responsive to a signal transition on the dummy wordline return DWL_RET. The reset signal in the read mode of operation therefore has a pulse width that is independent of any delays associated with RC loading on the dummy wordline DWL, and is typically asserted earlier in time than a corresponding reset signal in the write mode of operation, resulting in a shorter pulse width for the CKINT signal and other associated global signals, as will be illustrated in the timing diagrams of FIG. 5.

As noted above, the internal clock signal CKINT is generated in internal clock generator 203 using the reset signal provided by the multiplexer 202. More particularly, the pulse width of CKINT is determined by the reset signal in the present embodiment, as will be illustrated in the timing diagrams of FIG. 5. Other global signals such as actual wordline signals WL are gated by CKINT, and so the reset signal indirectly controls the pulse widths of these other global signals as well.

Accordingly, in the read mode of operation, the reset signal is asserted earlier in time, such that WL and other global signals that are controlled at least in part by the reset signal can be returned to their respective low-power or "golden" states sooner than would otherwise be possible, thereby reducing dynamic power consumption in the memory device. Moreover, in the write mode of operation, the reset signal is asserted later in time, thereby increasing the pulse width of the internal clock CKINT, and ensuring that WL and other global signals will have a sufficient write window to successfully complete the writing of data to all of their corresponding memory cells 105.

It is to be appreciated that numerous other types and arrangements of multiplexing circuitry may be used to generate the reset signal in control signal 150.

Figure 3:
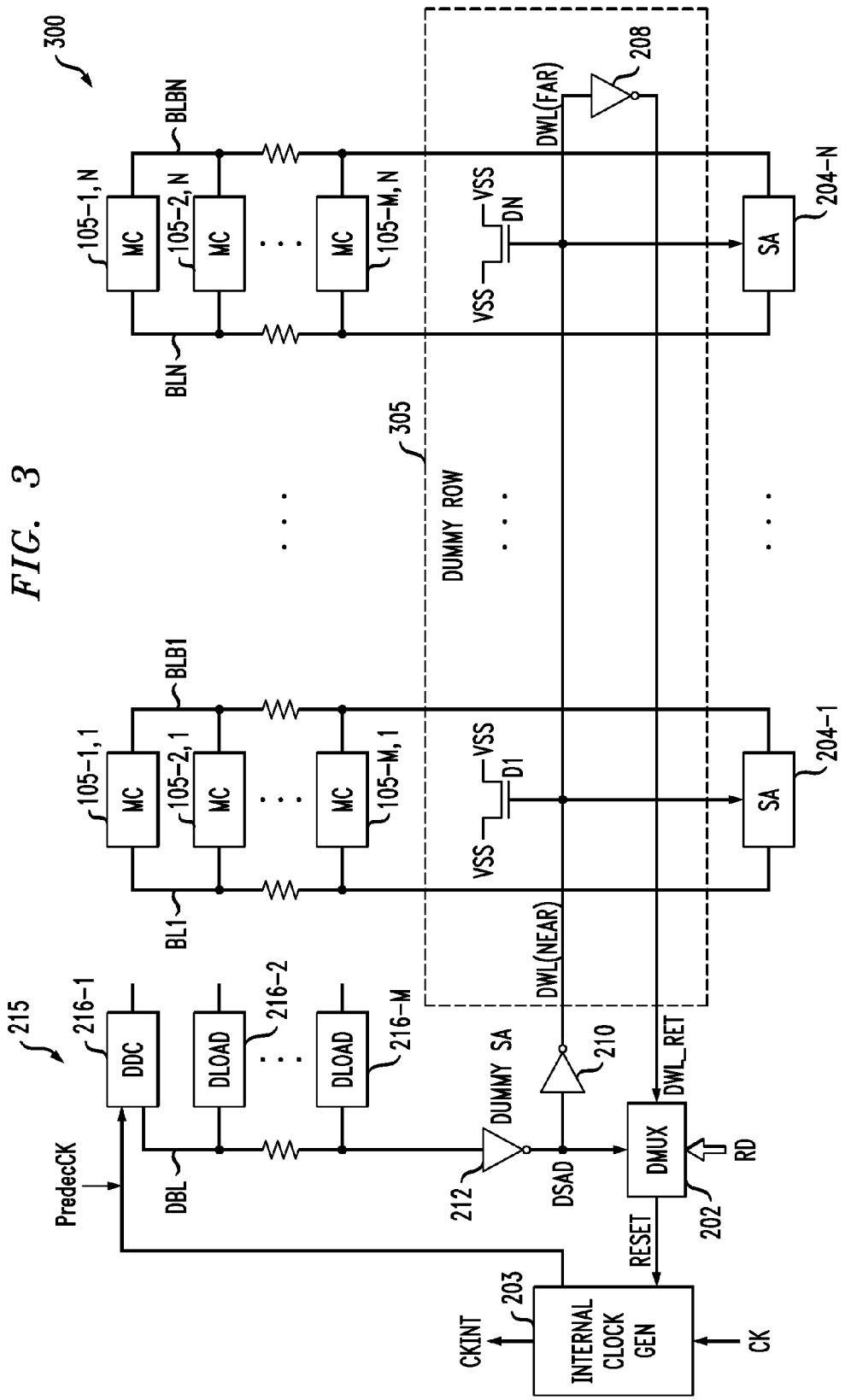
FIG. 3 shows another embodiment of a portion of the FIG. 1 memory device.

Also, the particular configuration of the dummy row 205 may be altered in other embodiments. For example, FIG. 3 shows a circuitry portion 300 which is generally similar to the circuitry portion 200 of FIG. 2 but with the DROW cells of dummy row 205 replaced by respective field effect transistors, and more particularly N-type metal-oxide-semiconductor (NMOS) devices D1 through DN, in a dummy row 305.

Each such NMOS device D1 through DN has its gate coupled to the dummy wordline DWL and to the enable input of a corresponding one of the sense amplifiers 204, and its drain and source coupled to a lower supply voltage, illustratively implemented as VSS in the figure.

The NMOS devices D1 through DN in this embodiment are each sized to provide a load on the dummy wordline DWL that approximates a load provided on an actual wordline WL by one or more of the memory cells 105 of the memory array 102. Thus, for example, if column multiplexing is used in the memory device 102, the NMOS devices D1 through DN would each be sized to mimic the collective load associated with multiple memory cells from the respective multiplexed columns.

Figure 4A:
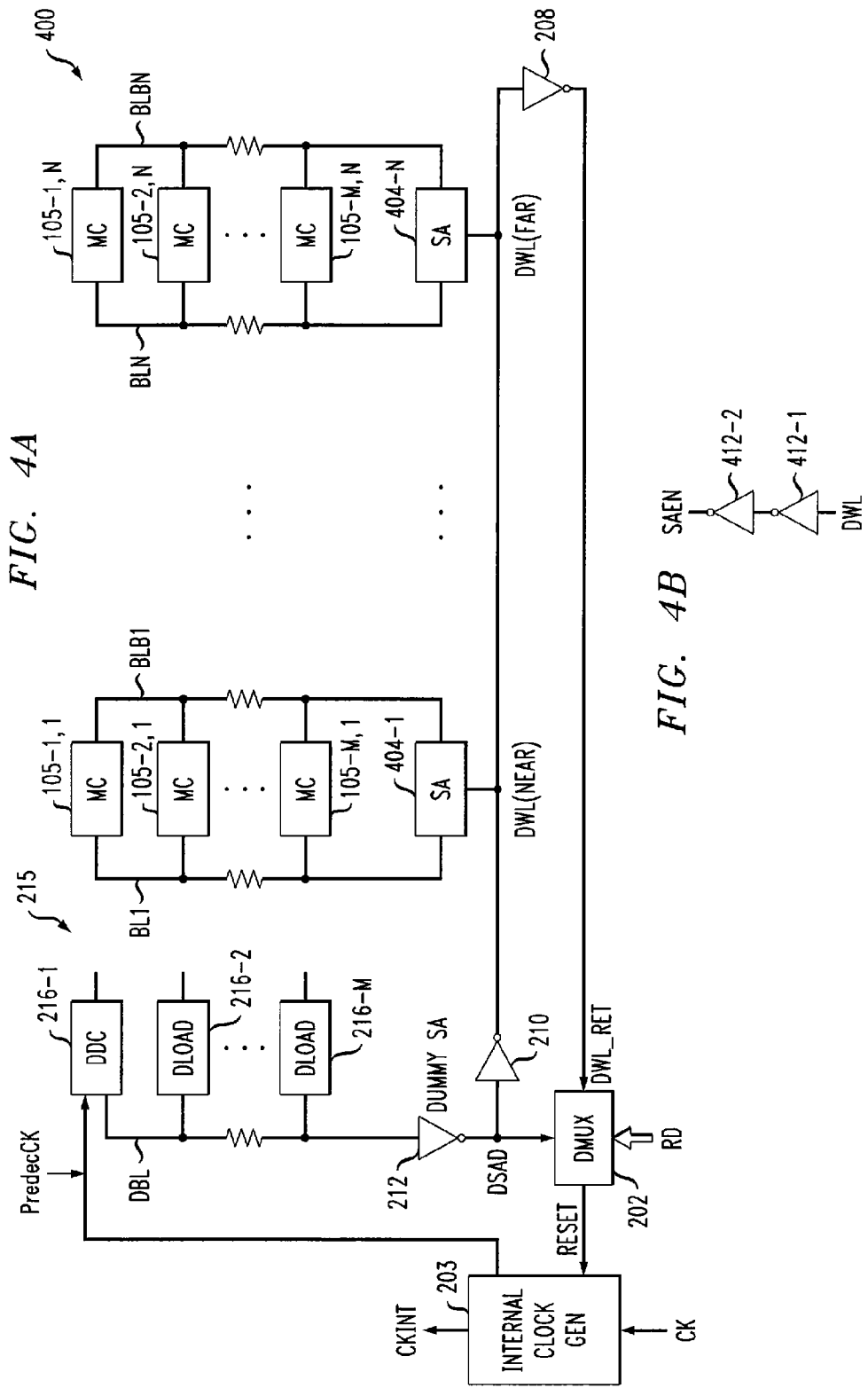
FIG. 4A shows yet another embodiment of a portion of the FIG. 1 memory device.
Figure 4B:
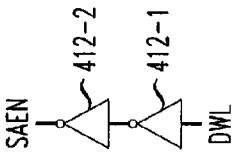
FIG. 4B illustrates the generation of a sense amplifier enable signal in the FIG. 4A embodiment.

Another embodiment illustrated in FIG. 4 comprises circuitry portion 400 which is generally similar to the circuitry portion 200 of FIG. 2 but with the dummy row eliminated altogether. Instead, in this embodiment, as shown more particularly in FIG. 4A, sense amplifiers 404-1 through 404-N have their respective enable inputs coupled to the dummy wordline DWL and are configured to provide a load on the dummy wordline DWL that approximates a load provided on an actual wordline WL by one or more of the memory cells 105 of the memory array 102. As shown in FIG. 4B, an input inverter 412-1 associated with the enable input of a given one of the sense amplifiers 404 has its input coupled to the dummy wordline DWL and is sized to provide the load on the dummy wordline DWL that approximates the load provided on the actual wordline WL by the one or more memory cells of the memory array. The input inverter 412-1 is arranged in series with a second inverter 412-2, the output of which represents the SAEN signal to be applied to the enable input of the given sense amplifier. Again, if column multiplexing is used in the memory device 102, the input inverters of the respective sense amplifiers 404 would each be sized to mimic the collective load associated with multiple memory cells from the respective multiplexed columns.

Figure 5A:
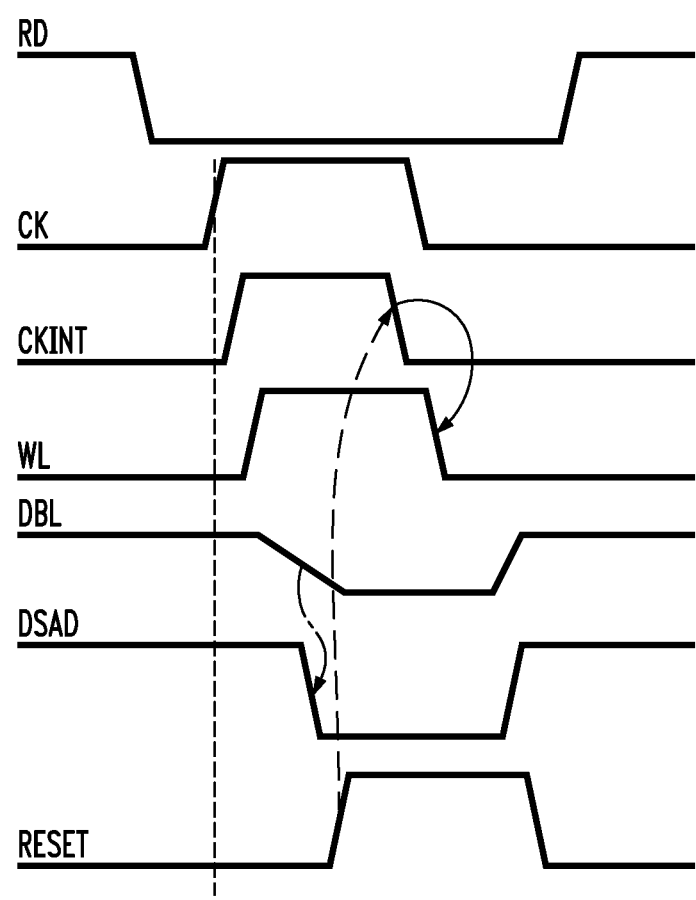
FIGS. 5A, 5B and 5C are timing diagrams illustrating the operation of the circuitry of FIGS. 2, 3 and 4.
Figure 5B:
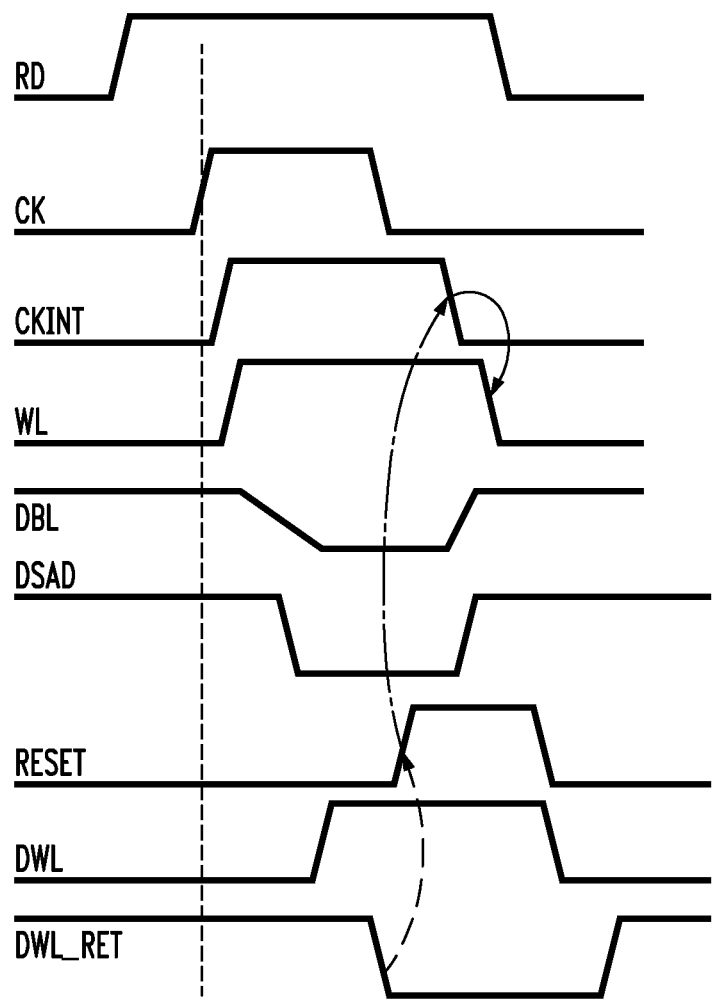

FIGS. 5A and 5B are timing diagrams illustrating the relationships between various signals in the embodiments of FIGS. 2, 3 and 4 for respective exemplary read and write operations in the memory device 100. More particularly, these two timing diagrams show control signal RD, external clock signal CK, internal clock signal CKINT, signals on actual wordline WL and dummy bitline DBL, and the DSAD and reset signals. The FIG. 5B timing diagram additionally shows the signals on the dummy wordline DWL and the dummy wordline return DWL_RET, which are not shown in the timing diagram of FIG. 5A.

With reference to the FIG. 5A timing diagram, the control signal RD goes low for the read mode, and a rising edge of external clock CK triggers a rising edge of internal clock CKINT. The multiplexer 202 generates the reset signal from the DSAD signal, which transitions responsive to discharge of the dummy bitline DBL. The rising edge of the reset signal triggers the falling edge of CKINT as indicated, which in turn triggers the falling edge of the actual wordline signal WL.

With reference to the FIG. 5B timing diagram, the control signal RD goes high for the write mode, and a rising edge of external clock CK again triggers a rising edge of internal clock CKINT. The multiplexer 202 generates the reset signal from the DWL_RET signal, which transitions after the signal delay associated with the RC loading of the dummy wordline DWL. The rising edge of the reset signal triggers the falling edge of CKINT as indicated, which in turn triggers the falling edge of the actual wordline signal WL.

Figure 5C:
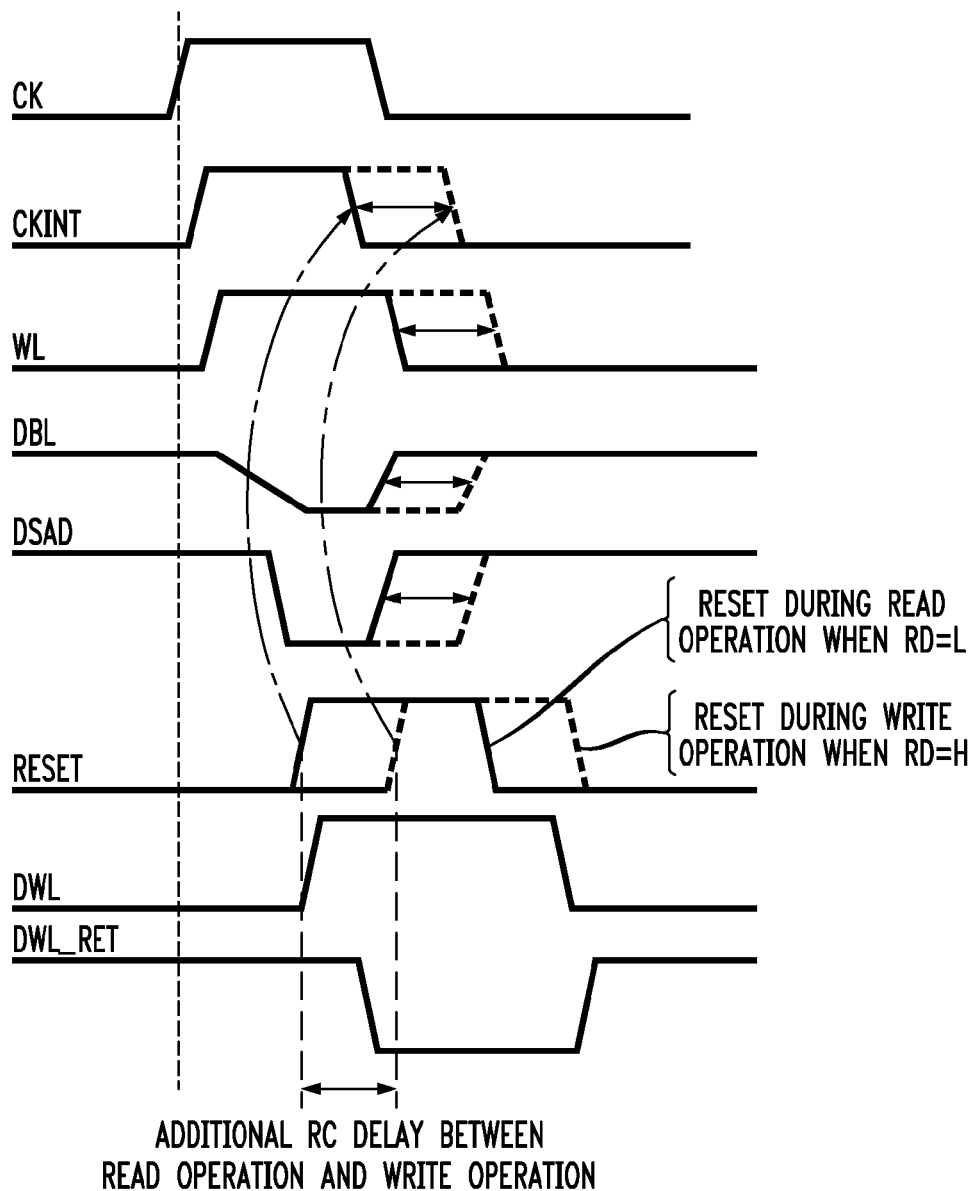

The timing diagram of FIG. 5C shows substantially the same signals of the FIG. 5A and FIG. 5B timing diagrams, less the control signal RD, and superimposes the two reset signals, as well as two instances of each of the CKINT, WL, DBL and DSAD signals, as generated for the respective read and write modes of operation. It can be seen that the reset signal in the read mode of operation is asserted earlier in time than the reset signal in the write mode of operation. This causes the internal clock signal CKINT and the additional global signal WL to have shorter pulse widths in the read mode of operation than these signals have in the write mode of operation.

In this embodiment, the time difference between assertion of the reset signal in the read mode of operation and assertion of the reset signal in the write mode of operation is given approximately by the additional signal delay associated with RC loading of the dummy wordline DWL, as reflected in the delayed transition of the DWL_RET signal relative to the DWL signal. Accordingly, in deep submicron process technologies, where horizontal RC delay begins to dominate over gate delays at fast process corners, the disclosed techniques serve to increase self-time pulse widths in proportion to horizontal RC delay, thereby ensuring that a sufficient write window is provided for all memory cells 105 of the memory array 102.

It should be noted that generation of a reset signal in a read mode of operation or a write mode of operation as described herein is intended to be broadly construed, so as to encompass, for example, arrangements in which a reset signal is initially asserted while a control signal such as RD is at the logic level associated with a particular mode but the reset signal remains asserted beyond a subsequent transition in the control signal. Accordingly, a reset signal in a read or write mode may be initially asserted in that mode but may have a pulse width that extends beyond a transition to another mode. The disclosed techniques can be adapted in a straightforward manner for use with a wide variety of different reset signals, mode control signals and memory operating modes.

The illustrative embodiments described above provide improved generation of a reset signal in read and write modes of operation of a memory device, allowing global signal pulse widths to be substantially decreased in read mode while also ensuring that these pulse widths are sufficiently wide in write mode to accommodate wordline signal delays attributable to RC loading effects. Arrangements of this type can significantly reduce memory cycle times and dynamic power consumption, thereby improving the overall operating performance of the memory device 100.

It is to be appreciated that the particular control circuitry configurations illustrated in FIGS. 2 through 4 are presented by way of illustrative example only, and other embodiments may use other types and arrangements of control circuitry. The term "control circuitry" as used herein is therefore intended to be broadly construed, and should not be viewed as being limited to the particular arrangements shown and described in conjunction with the illustrative embodiments.

For example, in one or more of these other embodiments, the conductivity types of at least a subset of the NMOS transistors of the control circuitry may be reversed, and other suitable modifications may be made to the circuitry and associated signaling levels, as would be appreciated by one skilled in the art. Also, other types of sense amplifiers and other memory device components may be used in implementing other embodiments. The term "sense amplifier" as used herein is therefore intended to be broadly construed so as to encompass a wide variety of different arrangements of sensing circuitry.

Embodiments of the invention are particularly well suited for use in high-speed SRAMs and DRAMs, as well as other types of memories that demand high read speeds, such as content-addressable memories (CAMs) and processor register files.

A given memory device configured in accordance with an embodiment of the invention may be implemented as a stand-alone memory device, for example, as a packaged integrated circuit memory device suitable for incorporation into a higher-level circuit board or other system. Other types of implementations are possible, such as an embedded memory device, where the memory may be, for example, embedded into a processor or other type of integrated circuit device which comprises additional circuitry coupled to the memory device. More particularly, a memory device as described herein may comprise, for example, an embedded memory implemented within a microprocessor, digital signal processor (DSP), application-specific integrated circuit (ASIC), field-programmable gate array (FPGA) or other type of processor or integrated circuit device.

Figure 6:
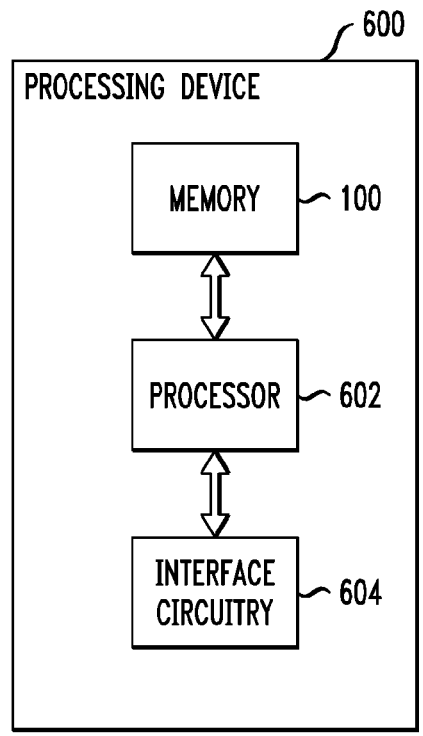
FIG. 6 is a block diagram of a processing device which incorporates the memory device of FIG. 1.

FIG. 6 shows an embodiment of a processing device 600 which incorporates the memory device 100 of FIG. 1. In this embodiment, the memory device 100 is coupled to a processor 602. The processing device further includes interface circuitry 604 coupled to the processor 602. The processing device 600 may comprise, for example, a computer, a server or a portable communication device such as a mobile telephone. The interface circuitry 604 may comprise one or more transceivers for allowing the device 600 to communicate over a network.

Figure 7:
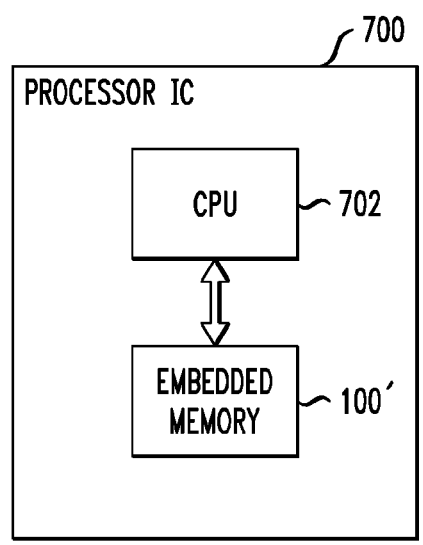
FIG. 7 is a block diagram of a processor integrated circuit which incorporates the memory device of FIG. 1 as an embedded memory.

Alternatively, processing device 600 may comprise a microprocessor, DSP or ASIC, with processor 602 corresponding to a central processing unit (CPU) and memory device 100 providing at least a portion of an embedded memory of the microprocessor, DSP or ASIC. FIG. 7 shows an example of an arrangement of this type, with processor integrated circuit 700 incorporating the memory device of FIG. 1 as an embedded memory 100'. The embedded memory 100' in this embodiment is coupled to a CPU 702. The embedded memory may comprise, for example, a high-speed register file. Numerous alternative embedded memory embodiments are possible.

As indicated above, embodiments of the invention may be implemented in the form of integrated circuits. In fabricating such integrated circuits, identical die are typically formed in a repeated pattern on a surface of a semiconductor wafer. Each die includes a memory device with a memory array, sense amplifiers and control circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of this invention.

Again, it should be emphasized that the above-described embodiments of the invention are intended to be illustrative only. For example, other embodiments can use different types and arrangements of memory arrays, memory cell circuitry, sense amplifiers, control circuitry, multiplexing circuitry, signal generation circuitry, transistor conductivity types, reset signals, control signals, modes of operation, and other elements, signals and operating parameters for implementing the described functionality. Also, the various assumptions made in conjunction with describing the illustrative embodiments need not apply in other embodiments. These and numerous other alternative embodiments within the scope of the following claims will be apparent to those skilled in the art.

What is claimed is:

1. A memory device comprising:
a memory array comprising a plurality of memory cells; and
a plurality of sense amplifiers configured to sense data stored in the memory cells of the memory array;
a dummy wordline coupled to respective enable inputs of the sense amplifiers;
a dummy wordline return;
a dummy bitline;
a dummy sense amplifier having an input coupled to the dummy bitline; and
control circuitry coupled to an output of the dummy sense amplifier and the dummy wordline return;
the control circuitry having a first configuration for generating a reset signal based at least in part on a signal at the output of the dummy sense amplifier in a read mode of operation;
the control circuitry further having a second configuration different than the first configuration for generating the reset signal based at least in part on a signal on the dummy wordline return in a write mode of operation.

2. The memory device of claim 1 wherein the control circuitry comprises multiplexing circuitry having a first input coupled to the output of the dummy sense amplifier, a second input coupled to the dummy wordline return, and a reset output providing the reset signal as a function of a selected one of the first and second inputs.

3. The memory device of claim 2 wherein the multiplexing circuitry is configured to select one of the first and second inputs responsive to a logic level of a control signal that has a first logic level in the read mode of operation and a second logic level in the write mode of operation.

4. The memory device of claim 3 wherein the multiplexing circuitry comprises:

a first tristate inverter coupled between the first input and the reset output; and
a second tristate inverter coupled between the second input and the reset output.

5. The memory device of claim 4 wherein the first tristate inverter has first and second control inputs driven by the control signal and a complement of the control signal, and the second tristate inverter also has first and second control inputs but driven in an opposite manner by the control signal and the complement of the control signal.

6. The memory device of claim 4 wherein in the read mode of operation the multiplexing circuitry is configured to connect the first input to the reset output via the first tristate inverter and to disconnect the second input from the reset output via the second tristate inverter, and in the write mode of operation the multiplexing circuitry is configured to connect the second input to the reset output via the second tristate inverter and to disconnect the first input from the reset output via the first tristate inverter.

7. The memory device of claim 1 wherein the dummy sense amplifier is implemented as a single inverter.

8. The memory device of claim 1 further comprising a row of dummy memory cells with each such dummy memory cell coupled to the dummy wordline and to the enable input of a corresponding one of the sense amplifiers.

9. The memory device of claim 1 further comprising a row of field effect transistors with each such field effect transistor each having a gate coupled to the dummy wordline and to the enable input of a corresponding one of the sense amplifiers.

10. The memory device of claim 9 wherein the field effect transistors are each sized to provide a load on the dummy wordline that approximates a load provided on an actual wordline by one or more of the memory cells of the memory array.

11. The memory device of claim 1 wherein the enable inputs of the respective sense amplifiers are each coupled to the dummy wordline and configured to provide a load on the dummy wordline that approximates a load provided on an actual wordline by one or more of the memory cells of the memory array.

12. The memory device of claim 11 wherein an input of an input inverter associated with the enable input of a given one of the sense amplifiers is coupled to the dummy wordline and the input inverter is sized to provide the load on the dummy wordline that approximates the load provided on the actual wordline by said one or more memory cells of the memory array.

13. The memory device of claim 1 wherein the control circuitry further comprises signal generation circuitry configured to generate at least one internal clock signal for the memory device at least in part as a function of the reset signal.

14. The memory device of claim 1 wherein in the read mode of operation the reset signal is asserted responsive to sensing of a signal transition on the dummy bitline by the dummy sense amplifier and in the write mode of operation the reset signal is asserted responsive to a signal transition on the dummy wordline return.

15. The memory device of claim 1 wherein the reset signal in the read mode of operation is asserted earlier in time than the reset signal in the write mode of operation, thereby causing an internal clock signal and one or more additional global signals of the memory array to have shorter pulse widths in the read mode of operation than the internal clock signal and the one or more additional global signals have in the write mode of operation.

16. An integrated circuit comprising the memory device of claim 1.

17. A processing device comprising the memory device of claim 1.

18. A method comprising:
generating a reset signal in a memory device;
wherein the reset signal in a read mode of operation is generated based at least in part on a signal at an output of a dummy sense amplifier; and
wherein the reset signal in a write mode of operation is generated based at least in part on a signal on a dummy wordline return.

19. The method of claim 18 further comprising generating at least one internal clock signal for the memory device at least in part as a function of the reset signal.

20. The method of claim 18 wherein generating the reset signal comprises:
asserting the reset signal in the read mode of operation responsive to sensing of a signal transition on a dummy bitline by the dummy sense amplifier; and
asserting the reset signal in the write mode of operation responsive to a signal transition on the dummy wordline return.

21. The method of claim 18 wherein generating the reset signal comprises generating the reset signal in the read mode of operation such that the reset signal generated in the read mode of operation is asserted earlier in time than the reset signal generated in the write mode of operation, thereby causing an internal clock signal and one or more additional global signals of a memory array to have shorter pulse widths in the read mode of operation than the internal clock signal and the one or more additional global signals have in the write mode of operation.

22. An apparatus comprising:
control circuitry adapted for coupling to a memory array comprising a plurality of memory cells;
the control circuitry having a first configuration for generating a reset signal based at least in part on a signal at an output of a dummy sense amplifier in a read mode of operation;
the control circuitry further having a second configuration different than the first configuration for generating the reset signal based at least in part on a signal on a dummy wordline return in a write mode of operation.

\* \* \* \* \*